(12) United States Patent
Lee et al.

(10) Patent No.: US 11,162,997 B2
(45) Date of Patent: Nov. 2, 2021

(54) AUTOMATIC CIRCUIT BOARD TEST SYSTEM AND AUTOMATIC CIRCUIT BOARD TEST METHOD APPLIED THEREIN

(71) Applicant: Cheng Uei Precision Industry Co., Ltd., New Taipei (TW)

(72) Inventors: James Cheng Lee, La Habra, CA (US); Sheng Chieh Lo, New Taipei (TW); Chien Hang Chu, New Taipei (TW)

(73) Assignee: Cheng Uei Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 16/924,190

(22) Filed: Jul. 9, 2020

(65) Prior Publication Data

US 2021/0033661 A1    Feb. 4, 2021

(30) Foreign Application Priority Data

Aug. 1, 2019  (CN) .......................... 201910705478.7

(51) Int. Cl.
*G01R 31/28* (2006.01)
*H01H 47/00* (2006.01)

(52) U.S. Cl.
CPC ....... *G01R 31/2806* (2013.01); *H01H 47/002* (2013.01)

(58) Field of Classification Search
CPC ............ G01R 31/2801; G01R 31/2803; G01R 31/2805; G01R 31/2806; G01R 31/2808;
(Continued)

(56) References Cited

U.S. PATENT DOCUMENTS 3,854,125 A    12/1974  Ehling et al.
6,067,585 A    5/2000   Hoang
(Continued)

FOREIGN PATENT DOCUMENTS

| JP | 2007-57541 A | 3/2007 |
| JP | 2007-506160 A | 3/2007 |
| KR | 20100124399 A | 11/2010 |

OTHER PUBLICATIONS

European Patent Office, Search Report with Written Opinion, Patent Application No. EP20185249.8, dated Dec. 8, 2020.
(Continued)

*Primary Examiner* — Thang X Le
(74) *Attorney, Agent, or Firm* — Lin & Associates Intellectual Property, Inc.

(57) ABSTRACT

An automatic circuit board test system includes at least one switch module of board under test connected with a test board, a control module and a test process module. The test board includes a first signal interface, a second signal interface and a third signal interface and a repeater. The second signal interface and the third signal interface are mutually connected by a signal cable. The first signal interface is connected with the repeater. The at least one switch module of board under test is connected with the second signal interface and the third signal interface. The control module is connected with the at least one switch module of board under test. The control module controls the at least one switch module of board under test. The test process module is connected with the control module and the first signal interface by at least two serial port buses.

11 Claims, 8 Drawing Sheets

(58) Field of Classification Search
CPC ............ G01R 31/2818; G01R 31/2812; G01R 31/2889; G01R 31/2896; G01R 31/23181; G01R 31/318505; G01R 31/318508; G01R 31/07328; G01R 1/0433; G01R 1/0466; G01R 1/0483; G01R 1/06722; G01R 1/07378; G01R 1/07328
See application file for complete search history.

(56) References Cited

U.S. PATENT DOCUMENTS

| | | | |
|---|---|---|---|
| 6,381,239 B1 | 4/2002 | Atkinson et al. | |
| 7,216,050 B1 * | 5/2007 | Bachman | G01R 31/3171 |
| | | | 702/108 |
| 2002/0113598 A1 * | 8/2002 | Tsuji | G01R 31/309 |
| | | | 324/501 |
| 2005/0017729 A1 * | 1/2005 | Tsuji | G01R 31/309 |
| | | | 324/501 |
| 2013/0241584 A1 * | 9/2013 | Mao | G01R 31/00 |
| | | | 324/750.01 |
| 2014/0266285 A1 * | 9/2014 | Detofsky | G01R 31/2889 |
| | | | 324/756.05 |
| 2016/0248606 A1 | 8/2016 | Holzmann et al. | |
| 2020/0169489 A1 * | 5/2020 | Kniplitsch | G01R 31/31907 |

OTHER PUBLICATIONS

Japan Patent Office, Office Action, Patent Application No. JP2019-200299, dated Sep. 29, 2020, Japan.

* cited by examiner

FIG. 7

AUTOMATIC CIRCUIT BOARD TEST SYSTEM AND AUTOMATIC CIRCUIT BOARD TEST METHOD APPLIED THEREIN

CROSS-REFERENCE TO RELATED APPLICATION

The present application is based on, and claims priority from, China Patent Application No. 201910705478.7, filed Aug. 1, 2019, the disclosure of which is hereby incorporated by reference herein in its entirety.

BACKGROUND OF THE INVENTION

1. Field of the Invention

The present invention generally relates to an automatic test system, and more particularly to an automatic circuit board test system aiming at signal switches, and an automatic circuit board test method applied in the automatic circuit board test system.

2. The Related Art

A conventional automatic test equipment utilizes an automatic mechanism to proceed with a test of semiconductor products, electronic circuit devices and printed circuit boards. A test unit is a common important component of the conventional automatic test equipment. A function of the test unit mainly provides test signals for a DUT (Device Under Test) so as to proceed with a measurement of relevant parameters. A common mode is a Pseudo-Randon Binary Sequence (PRBS) for testing an error rate of the DUT feedback.

At present, an automatic test system on market proceeds with a seudo-Randon Binary Sequence test for the DUT, a tester just need input needed information and needed test parameters according to a test requirement and operate a graphical user interface (GUI) to change test programs, and because different test programs need exchange, and insert and withdraw a circuit of the DUT, a whole test reaches multiple steps.

A Taiwan patent with publication patent number 1479957 discloses a printed circuit board for extracting signals exchanged between the DUT and an automatic test equipment. The printed circuit board includes multiple first terminals, multiple second terminals, multiple transmission cables and an extracting circuit. The multiple first terminals contact a third terminal of an insertion groove of the DUT through an assembly between the multiple first terminals and the third terminal. The multiple second terminals contact a fourth terminal of a test structure of the automatic test equipment through an assembly between the multiple second terminals and the fourth terminal of the test structure. The multiple first terminals and the multiple second terminals are connected by the multiple transmission cables through an assembly process. An electric appliance is coupled with the multiple transmission cables by the extracting circuit. The exchanged signals between the DUT and the automatic test equipment through one transmission cable so as to provide the extracting signal. The extracting circuit includes a resistor or a resistor network. A loss imposed on the exchanged signal between the DUT and the automatic test equipment through one transmission cable is less than 6 dB on account of an existence of the printed circuit board.

A Taiwan patent with publication patent number I561839 discloses an integrated circuit test interface of the automatic test equipment which is capable of being upgraded for testing the DUT. The integrated circuit test interface includes at least one pin for receiving or transmitting at least one test signal to a test machine of the automatic test equipment, a plurality of digitizers coupled with the at least one pin to generate a digital signal, a processor coupled with the plurality of the digitizers for processing the digital signal, and a connecting element connected with the processor and a computer equipment for transmitting an output signal of the processor to the computer equipment. The integrated circuit test interface is disposed between the test machine and a needle test machine of the automatic test equipment.

So far, an existed problem of the automatic test system is that the automatic test system may just test one DUT, such as a DUT A and a DUT B. The automatic test system is connected with the DUT A to execute a test action. After the automatic test system completes testing, the DUT A must be taken down and is connected with the DUT B to execute the test action.

However, because products which are to be tested are more and more diverse, an operation of the automatic test system are more and more precise, relatively the automatic test system and an automatic test method with a stronger function is needed to meet a test requirement which is increasingly complex.

Thus, an innovative automatic circuit board test system for solving for solving the above-mentioned problems, the innovative automatic circuit board test system is capable of being connected with multiple products which are to be tested, and the multiple products which are to be tested are tested by virtue of a signal path switch. The innovative automatic circuit board test system with more elasticies and efficiencies is provided, and the innovative automatic circuit board test system aiming at signal switches simplifies a test flowchart and shortens test time.

SUMMARY OF THE INVENTION

An object of the present invention is to provide an automatic circuit board test system. The automatic circuit board test system includes at least one switch module of board under test connected with a test board, a control module and a test process module. The test board includes a first signal interface, a second signal interface and a third signal interface and a repeater. The second signal interface and the third signal interface are mutually connected by a signal cable. The first signal interface is connected with the repeater. The at least one switch module of board under test is connected with the second signal interface and the third signal interface, respectively. The at least one switch module of board under test includes a plurality of relays. The control module is connected with the at least one switch module of board under test by a control interface bus. The control module controls the at least one switch module of board under test. The test process module is for receiving encryption result data tested by the test board. The test process module is connected with the control module and the first signal interface, respectively by at least two serial port buses. The test process module transmits a control signal to the control module, the control module converts the control signal into a serial control signal, and then the control module transmits the serial control signal to the at least one switch module of board under test, the control module controls the plurality of the relays of the at least one switch module of board under test to switch signal paths, the test board transmits result data to the at least one switch module of board under test, the at least one switch module of board under test transmits the result data to the control module through a serial return signal, the control module converts the serial return signal into a return signal, and the encryption result data is transmitted to the test process module through the return signal.

Another object of the present invention is to provide an automatic circuit board test method applied in an automatic circuit board test system. The automatic circuit board test system includes at least one switch module of board under test which includes at least one relay module including a plurality of relays, and a software protector connected with the at least one relay module, a control module, a test process module connected with the control module, and a third serial port bus connected with the software protector. The at least one switch module of board under test is connected with a test board which includes a repeater, and a first signal interface connected with the repeater. Specific steps of the automatic circuit board test method are described hereinafter. Set a test mode. The test process module is connected with the first signal interface through the third serial port bus to make the repeater set to enter a test mode. Transmit a test signal instruction, the test process module transmits a control signal to the control module. Convert the control signal, the control module receives the control signal. The control signal is transmitted to a micro-controller of the control module, and the control signal is converted into a serial control signal. Compare data, the serial control signal is transmitted to a storage device of the control module, and a data comparison is executed in the storage device. The serial control signal is returned to the micro-controller. The micro-controller transmits the serial control signal to the at least one relay module. Switch a signal path, the at least one relay module receives the serial control signal, and the at least one relay module controls the plurality of the relays to switch paths, and then the at least one relay module transmits the serial control signal to the test board. Receive result data, the at least one relay module receives the result data, and then the result data is transmitted to the software protector through a serial return signal. Package the result data, the software protector receives the result data, the result data is packaged to form an encryption result data, and then the serial return signal is converted into the return signal, correspondingly, the encryption result data is transmitted to the test process module through the return signal. Store the encryption result data, the test process module receives the encryption result data, and the encryption result data is stored in the test process module.

Another object of the present invention is to provide an automatic circuit board test method applied in an automatic circuit board test system. The automatic circuit board test system includes at least one switch module of board under test which includes at least one relay module including a plurality of relays, and a software protector connected with the at least one relay module, a control module, a test process module connected with the control module, and a third serial port bus connected with the software protector. The at least one switch module of board under test is connected with a test board which includes a repeater, and a first signal interface connected with the repeater. Specific steps of the automatic circuit board test method are described hereinafter. Set a test mode, the test process module is connected with the first signal interface through the third serial port bus to make the repeater set to enter the test mode. Transmit a test signal instruction, the test process module transmits a control signal to the control module. Switch a signal path, the at least one relay module receives a serial control signal, and the at least one relay module controls the plurality of the relays to switch paths, and then the at least one relay module transmits the serial control signal to the test board. Execute a testing action, the test board receives the serial control signal, and the testing action is executed in the test board. Receive result data, the at least one relay module receives the result data, and then the result data is transmitted to the software protector. The result data is packaged to form an encryption result data, and the encryption result data is further transmitted to the control module through a serial return signal. Store the encryption result data, the test process module receives the encryption result data, and the encryption result data is stored in the test process module.

As described above, the automatic circuit board test system aiming at signal switches and the automatic circuit board test method applied in the automatic circuit board test system further simplify a test flowchart and shorten test time to have a practicability completely.

BRIEF DESCRIPTION OF THE DRAWINGS

The present invention will be apparent to those skilled in the art by reading the following description, with reference to the attached drawings, in which:

FIG. 7 is a schematic diagram of test result details of the automatic circuit board test system in accordance with the first preferred embodiment of the present invention.

DETAILED DESCRIPTION OF THE PREFERRED EMBODIMENT

Figure 1:
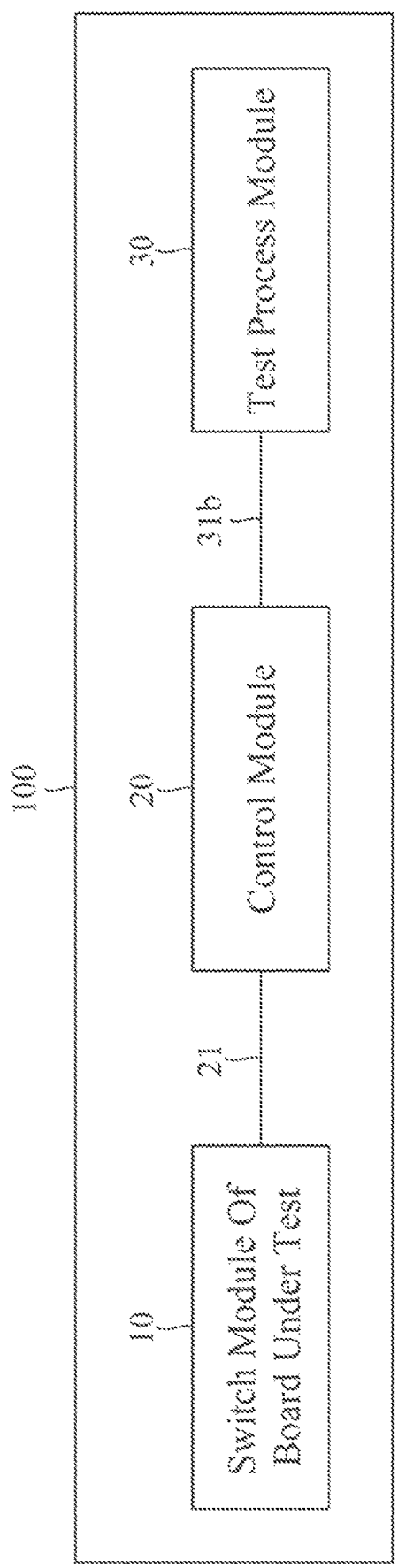
FIG. 1 is a schematic diagram of an automatic circuit board test system in accordance with a first preferred embodiment of the present invention.

With reference to FIG. 1, an automatic circuit board test system 100 in accordance with a first preferred embodiment of the present invention is shown. The automatic circuit board test system 100 includes at least one switch module of board under test 10, a control module 20, and a test process module 30 connected with the control module 20.

Figure 3:
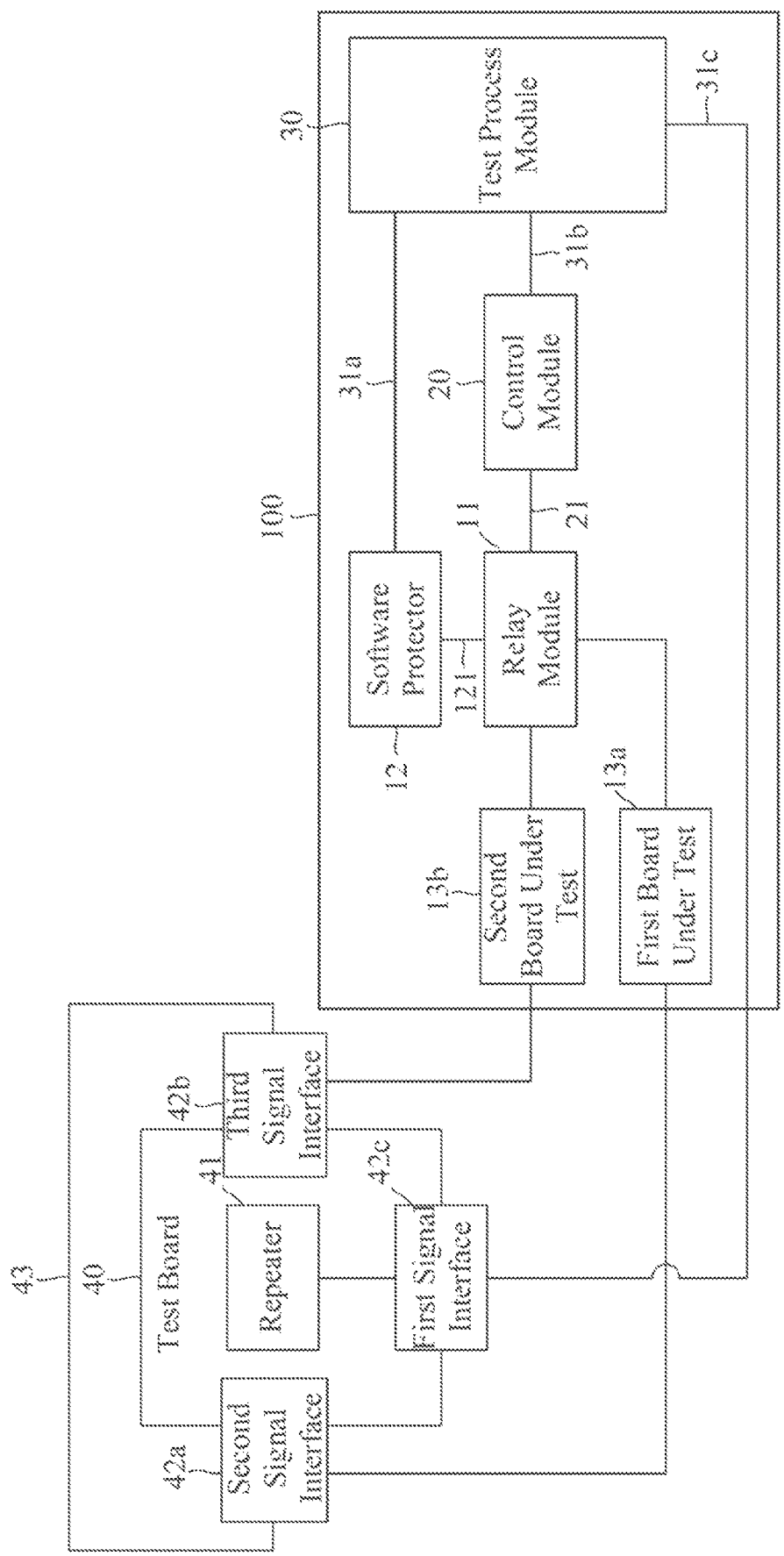
FIG. 3 is another schematic diagram of the automatic circuit board test system in accordance with the first preferred embodiment of the present invention.
Figure 4:
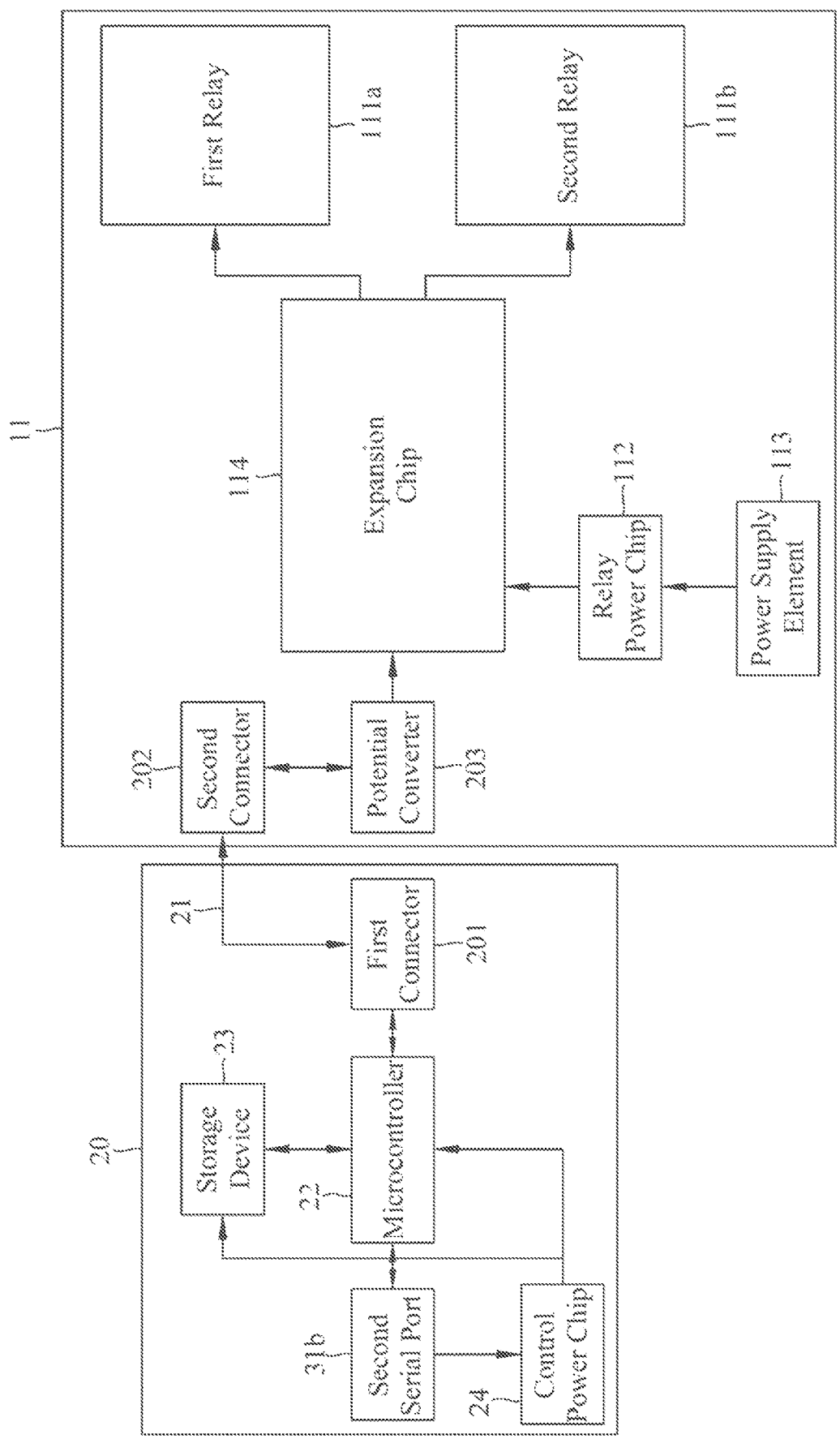
FIG. 4 is a schematic diagram showing that a control module is connected with a relay module of the automatic circuit board test system in accordance with the first preferred embodiment of the present invention.

Referring to FIG. 1, FIG. 3 and FIG. 4, the at least one switch module of board under test 10 is connected with a test board 40. The test board 40 includes a plurality of signal interfaces 42. The test board 40 includes a first signal interface 42c, a second signal interface 42a and a third signal interface 42b and a repeater 41. The first signal interface 42c is management data input/output 0 (MDIO0) interface. The second signal interface 42a is management data input/output 1 (MDIO1) interface. The third signal interface 42b is management data input/output 2 (MDIO2) interface. The plurality of the signal interfaces 42 include the first signal interface 42c, the second signal interface 42a and the third signal interface 42b. The second signal interface 42a and the third signal interface 42b are mutually connected by a signal cable 43. The first signal interface 42c is connected with the repeater 41. The at least one switch module of board under test 10 is connected with the second signal interface 42a and the third signal interface 42b, respectively. The at least one switch module of board under test 10 includes at least two boards under test 13, at least one relay module 11 including a plurality of relays 111, and a software protector 12 connected with the at least one relay module 11. The at least one switch module of board under test 10 includes the plurality of relays 111 which include a first relay 111a and a second relay 111b. In the first preferred embodiment, the signal cable 43 is a one-to-one test cable. The signal cable 43 is connected with the second signal interface 42a and the third signal interface 42b.

The automatic circuit board test system 100 in accordance with a second preferred embodiment of the present invention includes the plurality of the signal interfaces 42. The plurality of the signal interfaces 42 are the management data input/output1 (MDIO1) interface, the management data input/output 2 (MDIO2) interface, a management data input/output 3 (MDIO3) interface, a management data input/output 4 (MDIO4) interface and a management data input/output 5 (MDIO5) interface. The signal cable 43 is a one-to-four test cable. A quantity of the plurality of the signal interfaces 42 correspondingly use different types of the signal cables 43.

The control module 20 is connected with the at least one switch module of board under test 10 by a control interface bus 21 (Inter-Integrated Circuit, I2C). The control module 20 controls the at least one switch module of board under test 10. In the first preferred embodiment, an oscillation frequency of the control module 20 is 24 MHz. Nevertheless, the oscillation frequency of the control module 20 is without being limited within 24 MHz. The oscillation frequency of the control module 20 is changed according to designed circuits of designers.

The test process module 30 is GUI-PC (Graphical User Interface-Personal Computer). The test process module 30 is used for receiving encryption result data 32 tested by the test board 40. The automatic circuit board test system 100 includes three serial port buses 31 which are a first serial port bus 31a (USB 1), a second serial port bus 31b (USB 2) and a third serial port bus 31c (USB 3). The test process module 30 is connected with the control module 20 and the first signal interface 42c, respectively by at least two serial port buses 31. In the first preferred embodiment, the test process module 30 is connected with the control module 20 and the first signal interface 42c, respectively by the second serial port bus 31b (USB 2) and the third serial port bus 31c (USB 3).

Specifically, the test process module 30 transmits a control signal (USB signal) to the control module 20. The control module 20 converts the control signal (USB signal) into a serial control signal (I2C signal), and then the control module 20 transmits the serial control signal (I2C signal) to the at least one switch module of board under test 10. The control module 20 controls the plurality of the relays 111 of the at least one switch module of board under test 10 to switch signal paths. The test board 40 transmits result data to the at least one switch module of board under test 10. The at least one switch module of board under test 10 transmits the result data to the control module 20 through a serial return signal (I2C return signal). The control module 20 converts the serial return signal (I2C return signal) into a return signal (USB return signal), and the encryption result data 32 is transmitted to the test process module 30 through the return signal (USB return signal).

Figure 2:
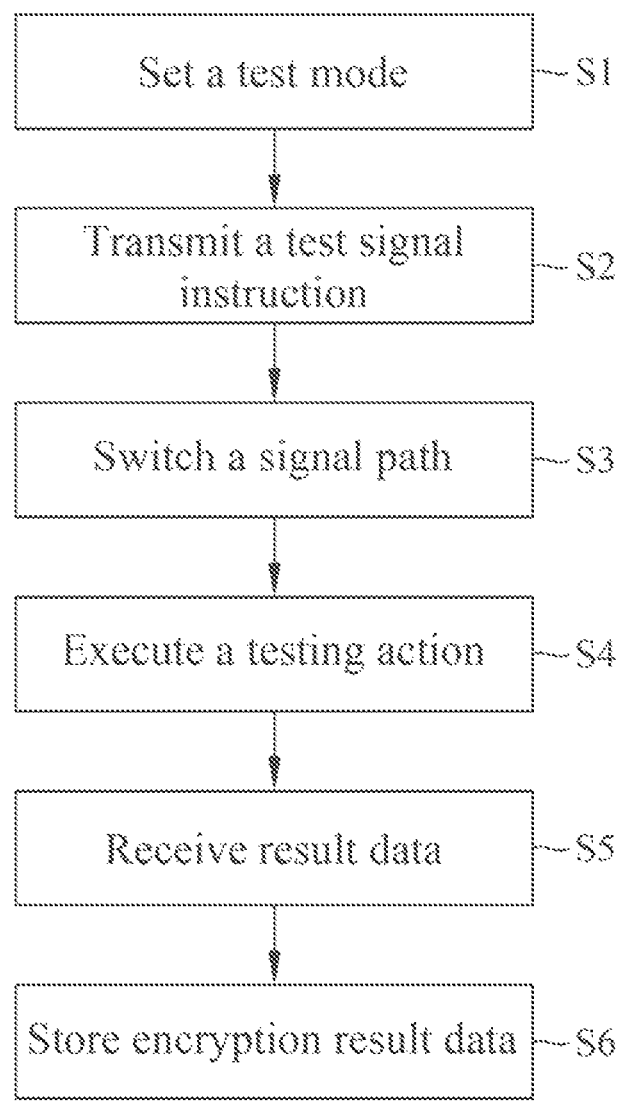
FIG. 2 is a flowchart of an automatic circuit board test method being applied in the automatic circuit board test system of FIG. 1.

Referring to FIG. 2, a flowchart of an automatic circuit board test method being applied in the automatic circuit board test system 100 is shown. Specific steps of the automatic circuit board test method are described as follows.

Step S1, set a test mode, specifically, the test process module 30 is connected with the first signal interface 42c through the third serial port bus 31c to make the repeater 41 set to enter the test mode.

Step S2, transmit a test signal instruction, specifically, the test process module 30 transmits the control signal (USB signal) to the control module 20.

Step S3, switch a signal path, specifically, the at least one relay module 11 of the at least one switch module of board under test 10 receives the serial control signal (I2C signal), and the at least one relay module 11 controls the plurality of the relays 111 to switch paths, and then the at least one relay module 11 of the at least one switch module of board under test 10 transmits the serial control signal (I2C signal) to the test board 40.

Step S4, execute a testing action, the test board 40 receives the serial control signal (I2C signal), and the testing action is executed in the test board 40.

Step S5, receive result data, the at least one relay module 11 of the at least one switch module of board under test 10 receives the result data, and then the result data is transmitted to the software protector 12, the result data is packaged to form the encryption result data 32, and the encryption result data 32 is further transmitted to the control module 20 through the serial return signal (I2C return signal).

Step S6, at last, store the encryption result data 32, specifically, the test process module 30 receives the encryption result data 32, and the encryption result data 32 is stored in the test process module 30.

In order to further know a structure characteristic, an application technology means and an anticipated achieved effect of the automatic circuit board test system 100 in accordance with the present invention, a usage way of the automatic circuit board test system 100 is described, and the automatic circuit board test system 100 is believed to be known more deeply and specifically.

Referring to FIG. 1 and FIG. 3, a schematic diagram of the automatic circuit board test system 100 in accordance with the first preferred embodiment of the present invention. The software protector 12 is a dongle. The at least two boards under test 13 include a first board under test 13a and a second board under test 13b. The at least two boards under test 13 are connected with the second signal interface 42a and the third signal interface 42b, respectively. The at least two boards under test 13 are connected with the at least one relay module 11. The at least one relay module 11 is connected with the control module 20 by the control interface bus 21 (Inter-Integrated Circuit, I2C). The software protector 12 encrypted the return data returned by the at least one relay module 11.

The first serial port bus 31a (USB 1) is connected with the first signal interface 42c. The second serial port bus 31b (USB 2) is connected with the control module 20. The third serial port bus 31c (USB 3) is connected with the software protector 12. The first signal interface 42c, the control module 20 and the software protector 12 are connected with the test process module 30 by the first serial port bus 31a (USB 1), the second serial port bus 31b (USB 2) and the third serial port bus 31c (USB 3). The at least one switch module of board under test 10 includes a plurality of the at least two boards under test 13 according to a user need. Preferably, the automatic circuit board test system 100 tests the plurality of the at least two boards under test 13.

Figure 5:
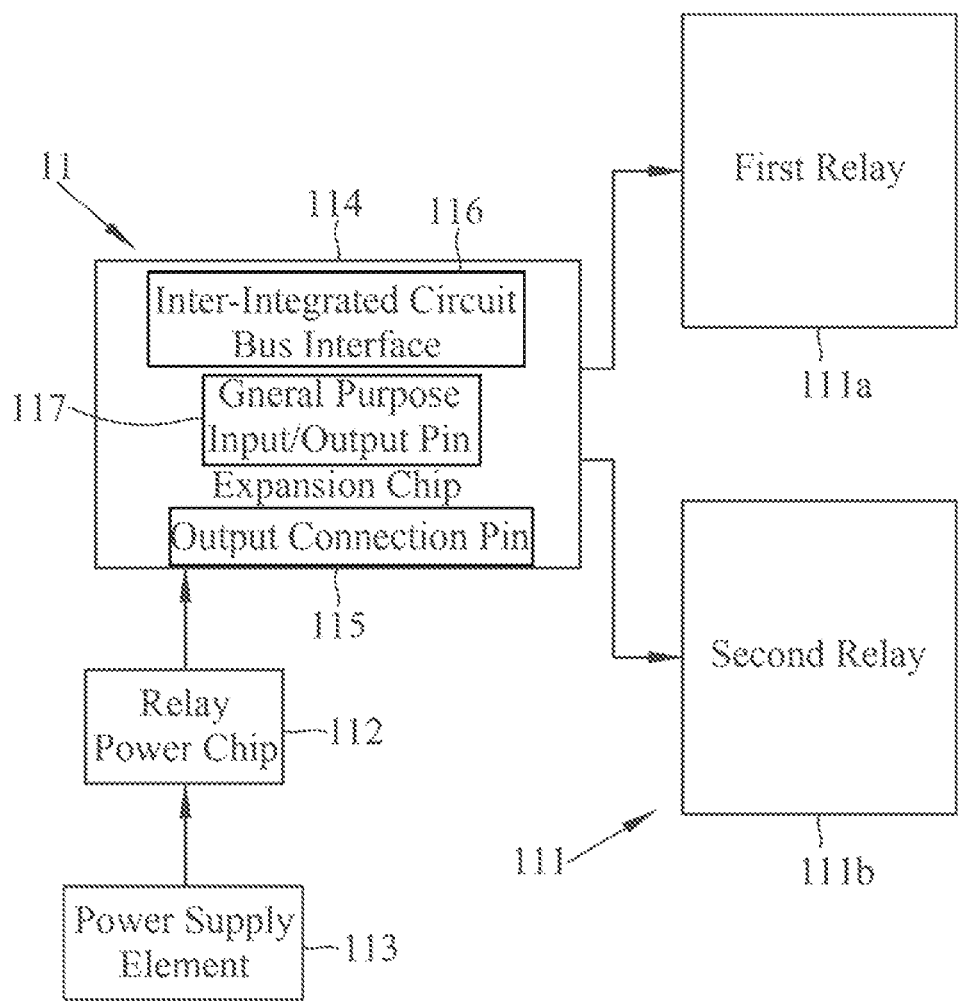
FIG. 5 is a schematic diagram of at least one relay module of at least one switch module of board under test of the automatic circuit board test system in accordance with the present invention.

Referring to FIG. 4 and FIG. 5, in the first preferred embodiment, the at least one relay module 11 includes the first relay 111a and the second relay 111b. The control module 20 is connected with the at least one relay module 11. The at least one relay module 11 controls an output connection pin 115 of an expansion chip 114 of the at least one relay module 11 by the serial control signal (I2C signal) to make switches of the plurality of the relays 111 which include the first relay 111a and the second relay 111b achieve switching signal paths. The expansion chip 114 has an inter-integrated circuit bus interface 116 (I2C interface) and a plurality of general purpose input/output pins 117 (GPIO).

Referring to FIG. 4 and FIG. 5, the control module 20 includes a control power chip 24. The control power chip 24 is used to provide 3.3V direct current voltage for a micro-controller 22 of the control module 20. The at least one relay module 11 includes a relay power chip 112. The relay power chip 112 is used to provide 3.3V direct current voltage for the expansion chip 114. The micro-controller 22 is connected with the first connector 201. The first connector 201 is connected with the second connector 202 by the control interface bus 21. The automatic circuit board test system 100 further includes a potential converter 203. The second connector 202 is connected with the potential converter 203. The potential converter 203 is connected with the expansion chip 114.

Figure 6:
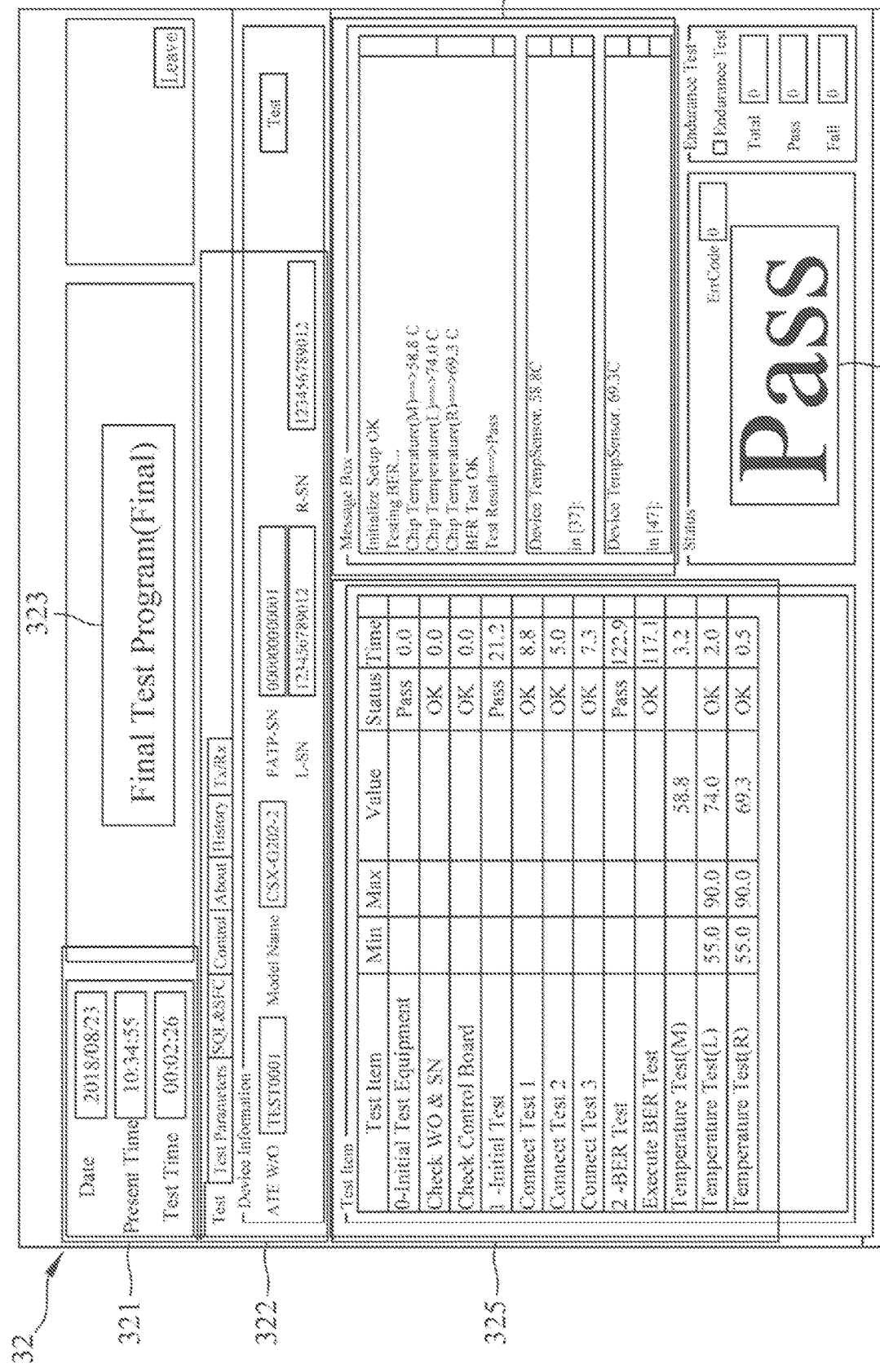
FIG. 6 is a schematic diagram of encryption result data of the automatic circuit board test system in accordance with the first preferred embodiment of the present invention.
Figure 8:
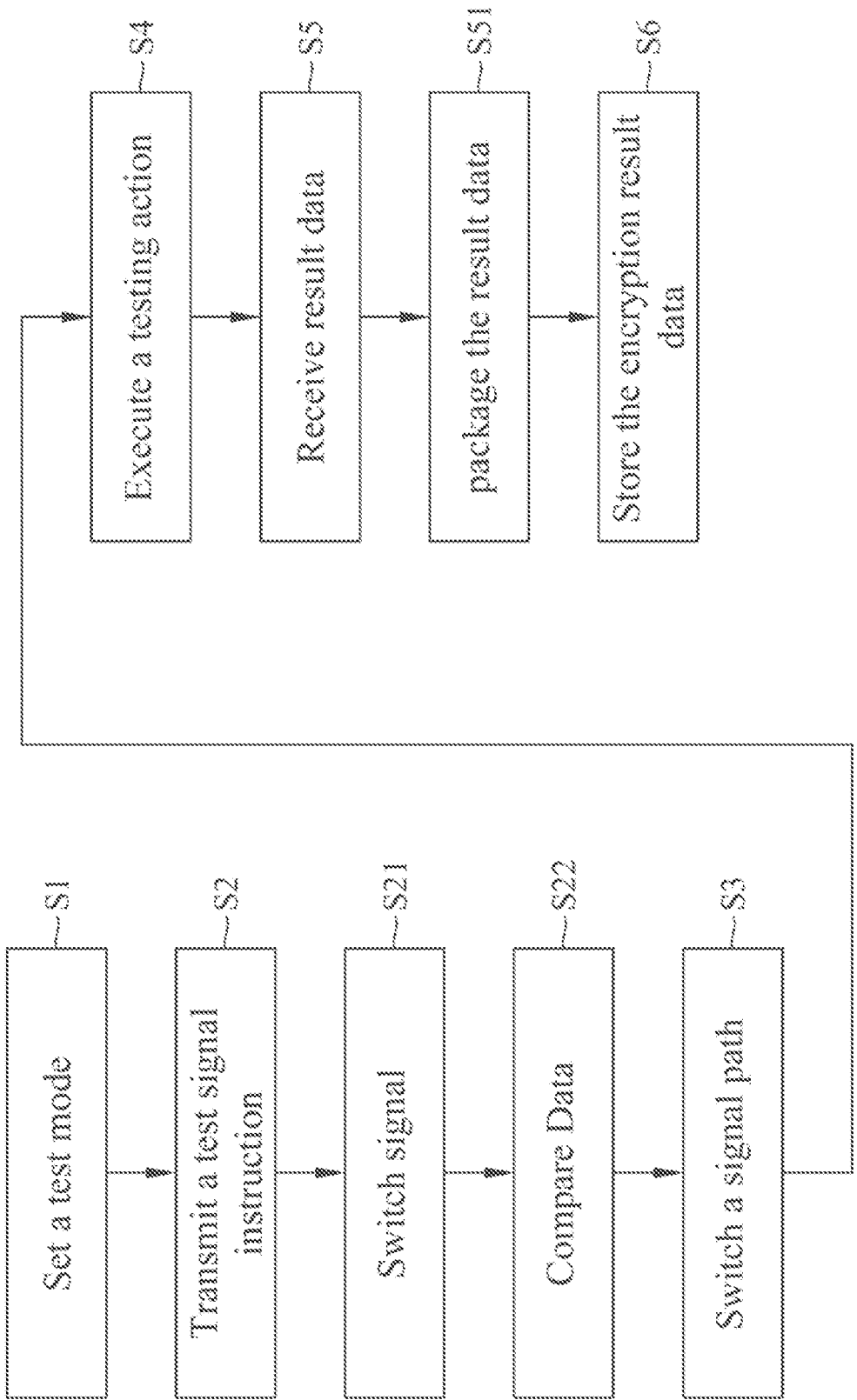
FIG. 8 is a flowchart of the automatic circuit board test method being applied in the automatic circuit board test system in accordance with the first preferred embodiment of the present invention.

Referring to FIG. 4 to FIG. 7, a schematic diagram of the encryption result data 32 of the automatic circuit board test system 100 in accordance with the first preferred embodiment of the present invention is shown in FIG. 5. A schematic diagram of test details 3261 of the automatic circuit board test system 100 in accordance with the first preferred embodiment of the present invention is shown in FIG. 6. The encryption result data 32 includes a test date time 321, work order information 322, a test station category 323, a test flowchart 324, a test item 325 and a test result 326. The test date time 321, work order information 322, the test station category 323, the test flowchart 324, the test item 325 and the test result 326 are stored in the test process module 30. The test result 326 includes a plurality of the test details 3261.

Referring to FIG. 4 to FIG. 6, in test items ranged between Connect Test0 and Connect Test2, a test content of the automatic circuit board test system 100 is connection conditions of various modules and components. An environmental setting condition of the automatic circuit board test system 100 is detected in further. The test flowchart 324 of the automatic circuit board test system 100 shows a flowchart of the various test items and shows the test result 326 in a column type.

Figure 7:
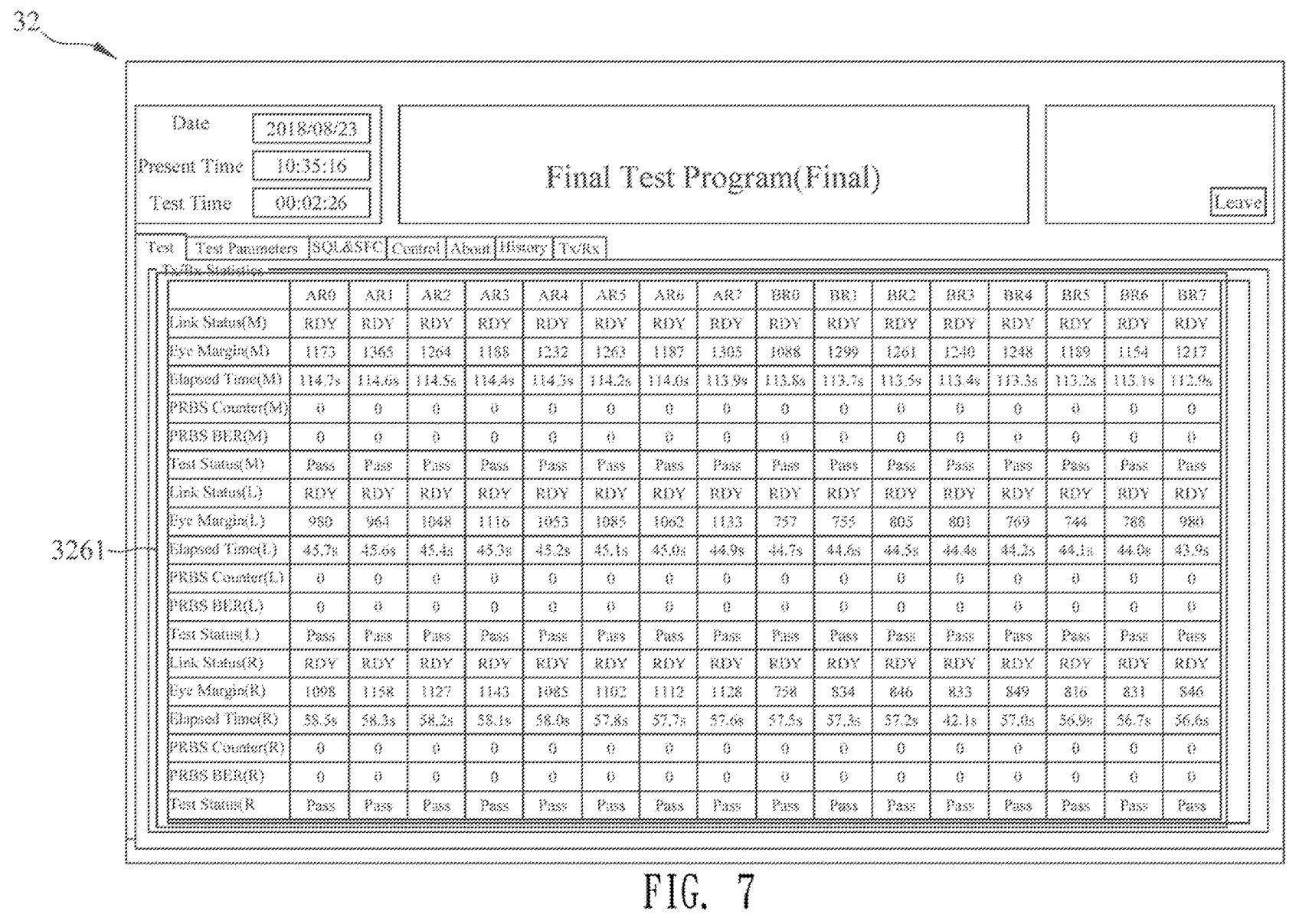

Referring to FIG. 1 to FIG. 8, a flowchart of the automatic circuit board test method being applied in the automatic circuit board test system 100 in accordance with the first preferred embodiment of the present invention is shown in FIG. 7. The automatic circuit board test system 100 is defined as a core operation basis. The automatic circuit board test method includes a plurality of steps. The plurality of the steps of the automatic circuit board test method being applied in the automatic circuit board test system 100 are specifically described as follows.

Firstly, in setting the test mode step S1, specifically, the test process module 30 is connected with the first signal interface 42c through the third serial port bus 31c (USB 3) to make the repeater 41 set to enter the test mode.

Secondly, in transmitting the test signal instruction step S2, specifically, the test process module 30 transmits the control signal (USB signal) to the control module 20, and the test process module 30 sends an instruction to the control module 20 through the second serial port bus 31b (USB 2).

A step S21 of converting the control signal is executed. The control module 20 receives the control signal (USB signal), the control signal (USB signal) is transmitted to the micro-controller 22 of the control module 20, and the control signal is converted into the serial control signal (I2C signal).

In the first preferred embodiment, the micro-controller 22 is a filed programmable gate array (FPGA) or a central processing unit (CPU).

A step S22 of comparing data is executed, the serial control signal is transmitted to a storage device (EEPROM) 23 of the control module 20, and a data comparison is executed in the storage device (EEPROM) 23, the serial control signal (I2C signal) is returned to the micro-controller 22. The micro-controller 22 transmits the serial control signal (I2C signal) to the at least one relay module 11.

It need be further described in the data comparison step S22, the storage device (EEPROM) 23 is a programmable read-only memory (PROM), an erasable programmable read-only memory, a flash memory, a non-volatile memory, a dynamic rand access memory (DRAM), a static rand access memory (SRAM), a volatile memory and so on.

Thirdly, in switching the signal path step S3, specifically, the control module 20 receives the control signal (USB signal), the control signal (USB signal) is transmitted to the micro-controller 22 of the control module 20, and the control signal (USB signal) is converted into the serial control signal (I2C signal).

In switching the signal path step S3, specifically, the at least one relay module 11 receives the serial control signal (I2C signal), and the at least one relay module 11 controls the first relay 111a and the second relay 111b to switch paths, and correspondingly, the at least one relay module 11 transmits the serial control signal (I2C signal) to the test board 40, the at least one relay module 11 switches the first relay 111a and the second relay 111b to make the software protector 12 connected with the second signal interface 42a.

Fourthly, in a step S51 of packaging the result data, the software protector 12 receives the result data, the result data is packaged to form the encryption result data 32, and then the serial return signal (I2C return signal) is converted into the return signal (USB return signal), correspondingly, the encryption result data 32 is transmitted to the test process module 30 through the return signal (USB return signal).

At last, in storing step S6, the test process module 30 receives the encryption result data 32, and then the encryption result data 32 is stored in the test process module 30.

The plurality of the steps of the automatic circuit board test method are executed by execution steps of setting the test mode step, transmitting the test signal instruction step, switching the signal path step, testing and returning data of the second signal interface 42a. When the second signal interface 42a and the third signal interface 42b test simultaneously, execute the above-mentioned steps repeatedly. Different characteristics are that the at least one relay module 11 switch the signal paths to make the software protector 12 connected with the second signal interface 42a or the third signal interface 42b, and test signal instruction is sent or the encryption result data 32 are returned.

The management data input/output 1 (MDIO1) interface, the management data input/output 2 (MDIO2) interface, the management data input/output 3 (MDIO3) interface, the management data input/output 4 (MDIO4) interface and the management data input/output 5 (MDIO5) interface of the automatic circuit board test system 100 in accordance with the second preferred embodiment of the present invention are connected with five boards under test. The step S3 of switching the signal path need be repeated five times. The step S5 of receiving the result data need be repeated five times. Quantities of the signal interfaces 42 are corresponding to types of the signal cables 43. Executing times of the step S3 of switching the signal path and the step S5 of receiving the result data are changed according to a change of the quantities of the signal interfaces 42.

A characteristic and an achieved expectation effect of the automatic circuit board test system 100 in accordance with the present invention are described as follows.

When the at least one switch module of board under test 10 is located at an operation status, the first relay 111a and the second relay 111b are switched swiftly to achieve switching the signal paths by virtue of the automatic circuit board test system 100 and the automatic circuit board test method. The first relay 111a and the second relay 111b are connected with the first board under test 13a and the second board under test 13b, respectively. In the whole test process of the automatic circuit board test system 100, the signal cables 43 have no need of being pulled out or being changed manually, and the first board under test 13a and the second board under test 13b have no need of being changed, the automatic circuit board test system 100 test automatically in the whole test process, and test time of the automatic circuit board test system 100 is decreased. Whole test time of the automatic circuit board test system 100 is ranged between 0 second and 200 seconds.

The automatic circuit board test system 100 in accordance with the present invention has following implementation effects and technology effects.

Firstly, the automatic circuit board test system 100 reaches a signal path switching effect by virtue of the first relay 111a and the second relay 111b of the at least one switch module of board under test 10 being switched, the signal cables 43 have no need of being pulled out or being changed manually, and the first board under test 13a and the second board under test 13b have no need of being changed, and a human resource is decreased.

Secondly, the test process module 30 stores the encryption result data 32 to make the automatic circuit board test system 100 have no need of recording the whole result data manually for preventing a recorder from recording wrongly and achieving lowering an error rate of the test result.

Thirdly, the automatic circuit board test system 100 analyzes the encryption result data 32 through the test process module 30, and the analyzed encryption result data 32 are shown on a user interface to provide a tester for watching a test result, the automatic circuit board test system 100 reaches a real-time data display effect in no need of a person having an engineering background to judge, so that test time and a human cost of the automatic circuit board test system 100 are decreased.

Fourthly, the automatic circuit board test system 100 and the automatic circuit board test method applied in the automatic circuit board test system 100 are capable of shortening the whole test time, the whole test time of the automatic circuit board test system 100 is able to be shortened to 150 seconds, the automatic circuit board test system 100 and the automatic circuit board test method applied in the automatic circuit board test system 100 further simplify a test flowchart and shorten the test time to have a practicability completely.

As described above, the automatic circuit board test system 100 aiming at signal switches and the automatic circuit board test method applied in the automatic circuit board test system 100 further simplify the test flowchart and shorten the test time to have the practicability completely.

Execution modes of the present invention is described by specific embodiments, persons familiar with the above-mentioned technology are capable of knowing other advantages and effects of the present invention by a content of a specification of the present invention. The present invention is capable of being executed or applied by virtue of other different specific embodiments, various details of the specification of the present invention are capable of being based on different viewpoints and applications to proceed with various modifications and changes without prejudice to a spirit of the present invention.

It must be understood that a structure, a proportion, a size, a quantity of elements and so on all cooperate with a content disclosed in the specification of the present invention to provide for a person familiar with the aforesaid technology to know and read. The structure, the proportion, the dimension, the quantity of elements and so on all cooperate with the content disclosed in the specification of the present invention are without being used for limiting applicable conditions of the present invention, so the structure, the proportion, the dimension, the quantity of elements and so on all cooperate with the content disclosed in the specification of the present invention are without an essential significance in technology, any structure modification, any proportion change or any size modification shall be within a covered scope of the content disclosed by the present invention with no effect of a caused effect and an achieved purpose of the present invention.

What is claimed is:

1. A test system, comprising:
a test board;
at least one switch module of board under test connected with the test board, the test board including a first signal interface, a second signal interface and a third signal interface and a repeater, the second signal interface and the third signal interface being mutually connected by a signal cable, the first signal interface being connected with the repeater, the at least one switch module of board under test being connected with the second signal interface and the third signal interface, respectively, the at least one switch module of board under test including a plurality of relays;
a control module connected with the at least one switch module of board under test by a control interface bus, the control module controlling the at least one switch module of board under test; and
a test process module for receiving encryption result data tested by the test board, the test process module being connected with the control module and the first signal interface, respectively by at least two serial port buses, wherein the test process module transmits a control signal to the control module, the control module converts the control signal into a serial control signal, and then the control module transmits the serial control signal to the at least one switch module of board under test, the control module controls the plurality of the relays of the at least one switch module of board under test to switch signal paths, the test board transmits result data to the at least one switch module of board under test, the at least one switch module of board under test transmits the result data to the control module through a serial return signal, the control module converts the serial return signal into a return signal, and the encryption result data is transmitted to the test process module through the return signal.

2. The test system as claimed in claim 1, wherein the at least one switch module of board under test includes at least two boards under test, at least one relay module and a software protector, the at least one switch module of board under test is connected with the second signal interface and the third signal interface, respectively, the at least two boards under test are connected with the at least one relay module, the at least one relay module is connected with the control module by the control interface bus, the software protector encrypted a return data returned by the at least one relay module, the test system includes three serial port buses which are a first serial port bus, a second serial port bus and a third serial port bus, the first serial port bus is connected with the first signal interface, the second serial port bus is connected with the control module, the third serial port bus is connected with the software protector.

3. The test system as claimed in claim 2, wherein the at least one relay module controls an output connection pin of an expansion chip of the at least one relay module by the serial control signal to make switches of the plurality of the relays achieve switching signal paths.

4. The test system as claimed in claim 3, wherein the control module includes a control power chip, the control power chip is used to provide 3.3V direct current voltage for a micro-controller of the control module, the at least one relay module includes a relay power chip, the relay power chip is used to provide 3.3V direct current voltage for the expansion chip.

5. The test system as claimed in claim 3, wherein the expansion chip has an inter-integrated circuit bus interface and a plurality of general purpose input/output pins.

6. The test system as claimed in claim 2, wherein an oscillation frequency of the control module is 24 MHz.

7. The test system as claimed in claim 1, wherein the encryption result data includes a test date time, work order information, a test station category, a test flowchart, a test item and a test result, and the encryption result data is stored in the test process module.

8. The test system as claimed in claim 7, wherein the test result includes a plurality of test details.

9. The test system as claimed in claim 1, wherein whole test time of the test system is ranged between 0 second and 200 seconds.

10. An automatic circuit board test method applied in an automatic circuit board test system, the automatic circuit board test system including at least one switch module of board under test which includes at least one relay module including a plurality of relays, and a software protector connected with the at least one relay module, a control module, a test process module connected with the control module, and a third serial port bus connected with the software protector, the at least one switch module of board under test being connected with a test board which includes a repeater, and a first signal interface connected with the repeater, comprising steps of:

setting a test mode, the test process module being connected with the first signal interface through the third serial port bus to make the repeater set to enter the test mode;

transmitting a test signal instruction, the test process module transmitting a control signal to the control module;

converting the control signal, the control module receiving the control signal, the control signal being transmitted to a micro-controller of the control module, and the control signal being converted into a serial control signal;

comparing data, the serial control signal being transmitted to a storage device of the control module, and a data comparison being executed in the storage device, the serial control signal being returned to the micro-controller, the micro-controller transmitting the serial control signal to the at least one relay module;

switching a signal path, the at least one relay module receiving the serial control signal, and the at least one relay module controlling the plurality of the relays to switch paths, and then the at least one relay module transmitting the serial control signal to the test board;

receiving result data, the at least one relay module receiving the result data, and then the result data being transmitted to the software protector through a serial return signal;

packaging the result data, the software protector receiving the result data, the result data being packaged to form an encryption result data, and then the serial return signal being converted into a return signal, correspondingly, the encryption result data being transmitted to the test process module through the return signal; and storing the encryption result data, the test process module receiving the encryption result data, and the encryption result data being stored in the test process module.

11. An automatic circuit board test method applied in an automatic circuit board test system, the automatic circuit board test system including at least one switch module of board under test which includes at least one relay module including a plurality of relays, and a software protector connected with the at least one relay module, a control module, a test process module connected with the control module, and a third serial port bus connected with the software protector, the at least one switch module of board under test being connected with a test board which includes a repeater, and a first signal interface connected with the repeater, comprising steps of:

setting a test mode, the test process module being connected with the first signal interface through the third serial port bus to make the repeater set to enter the test mode;

transmitting a test signal instruction, the test process module transmitting a control signal to the control module;

switching a signal path, the at least one relay module receiving a serial control signal, and the at least one relay module controlling the plurality of the relays to switch paths, and then the at least one relay module transmitting the serial control signal to the test board;

executing a testing action, the test board receiving the serial control signal, and the testing action being executed in the test board;

receiving result data, the at least one relay module receiving the result data, and then the result data being transmitted to the software protector, the result data being packaged to form an encryption result data, and the encryption result data being further transmitted to the control module through a serial return signal; and storing the encryption result data, the test process module receiving the encryption result data, and the encryption result data being stored in the test process module.

\* \* \* \* \*